United States Patent [19]

Lumbra et al.

[11] Patent Number: 5,508,883
[45] Date of Patent: Apr. 16, 1996

[54] AIR MIXER COOL PLATE

[75] Inventors: Douglas L. Lumbra, St. Albans; Mohammed S. Shaikh, Essex Junction, both of Vt.

[73] Assignee: International Business Machines Corporation, Armonk, N.Y.

[21] Appl. No.: 372,730

[22] Filed: Jan. 17, 1995

Related U.S. Application Data

[63] Continuation of Ser. No. 867,867, Apr. 10, 1992, abandoned.

[51] Int. Cl.⁶ ........................................ H05K 7/20
[52] U.S. Cl. .................... 361/697; 165/122; 257/722
[58] Field of Search .................. 62/414, 418; 165/80.3, 165/122, 126, 185, 903, 908; 174/15.1, 16.1, 16.3; 34/632, 633, 638, 223; 361/676–678, 688–690, 692, 695, 702, 704, 816, 820, 697; 257/712, 713, 721, 722, 723, 724

[56] References Cited

U.S. PATENT DOCUMENTS

| | | | |
|---|---|---|---|
| 3,549,949 | 12/1970 | Granberry | 361/820 |
| 4,093,021 | 6/1978 | Groom | 165/1 |
| 4,513,351 | 4/1985 | Davis et al. | |
| 4,701,828 | 10/1987 | Weiner | 361/692 |
| 4,765,400 | 8/1988 | Chu et al. | |
| 4,837,663 | 6/1989 | Zushi et al. | |
| 4,884,168 | 11/1989 | August et al. | |
| 4,961,125 | 10/1990 | Jordan et al. | |
| 4,970,579 | 11/1990 | Arldt | 357/81 |
| 4,996,589 | 2/1991 | Kajiwara et al. | |
| 5,016,090 | 5/1991 | Gaylon et al. | |
| 5,021,924 | 6/1991 | Kieda et al. | |
| 5,105,336 | 4/1992 | Jacoby et al. | 361/379 |
| 5,119,270 | 6/1992 | Bolton et al. | 361/384 |
| 5,210,680 | 5/1993 | Schiebler | 361/384 |

OTHER PUBLICATIONS

"Thermal Analysis—Package", Giuglianotti et al., IBM Federal Systems—Center, #65–544–095 Dec. 29, 1965.
"Evolution of Cooling—Perspective", Chu et al, IBM Tech Report, TR 00.3507, Jun. 30, 1988.
"Ventilation—Systems", Hammer et al, IBM Tech Discl Bull vol. 17 No. 9 Feb. 1975 pp. 2529, 2530.

Primary Examiner—Gerald P. Tolin
Attorney, Agent, or Firm—Lawrence H. Meier; James M. Leas

[57] ABSTRACT

An air mixer cool plate (100) for dissipating heat from a plurality of heat-generating elements (22) positioned in an air stream (26). The plate is made from a material having a thermal conductivity preferably ranging from 1 to 500 watts/meter-K and is designed to be positioned to contact the top surfaces of the heat-generating elements. The plate includes a plurality of apertures (106, 108) and a plurality of upstanding air deflectors (110). The apertures and deflectors are arranged so that when the plate is supported in predetermined relation to the heat-generating elements and the air stream, the plate will cause the air stream to be deflected so as to flow in intimate contact with the elements, thereby carrying heat away from the elements by convection and conduction.

7 Claims, 3 Drawing Sheets

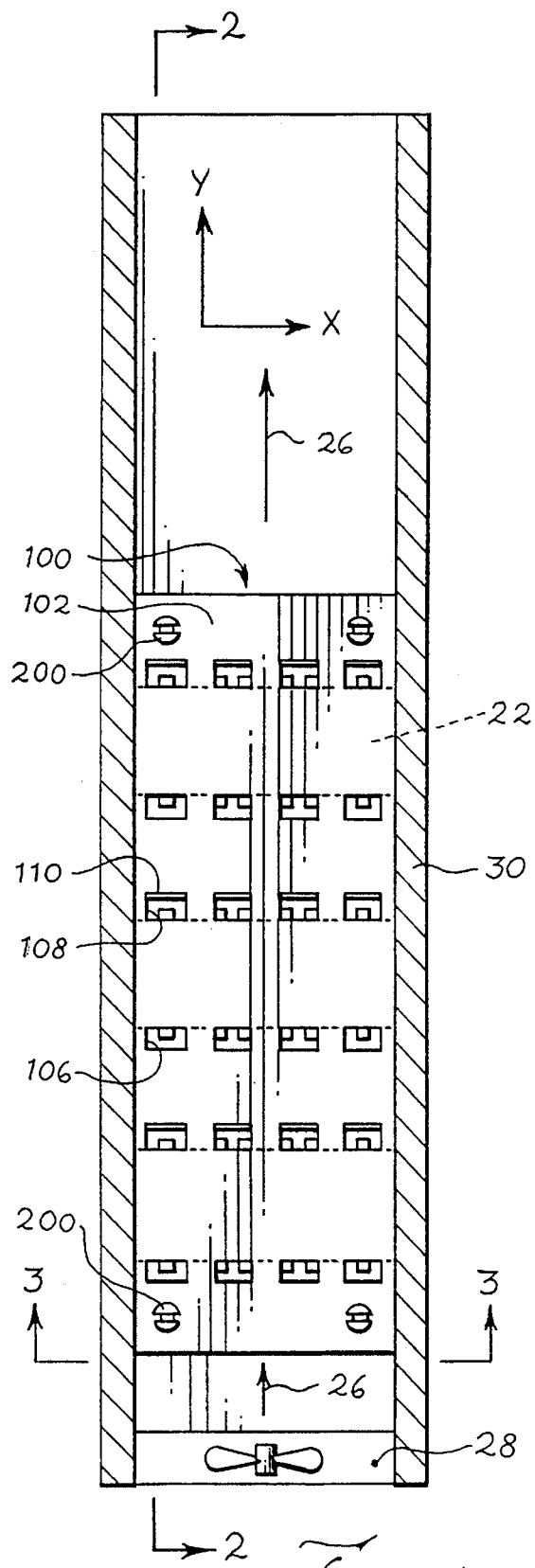
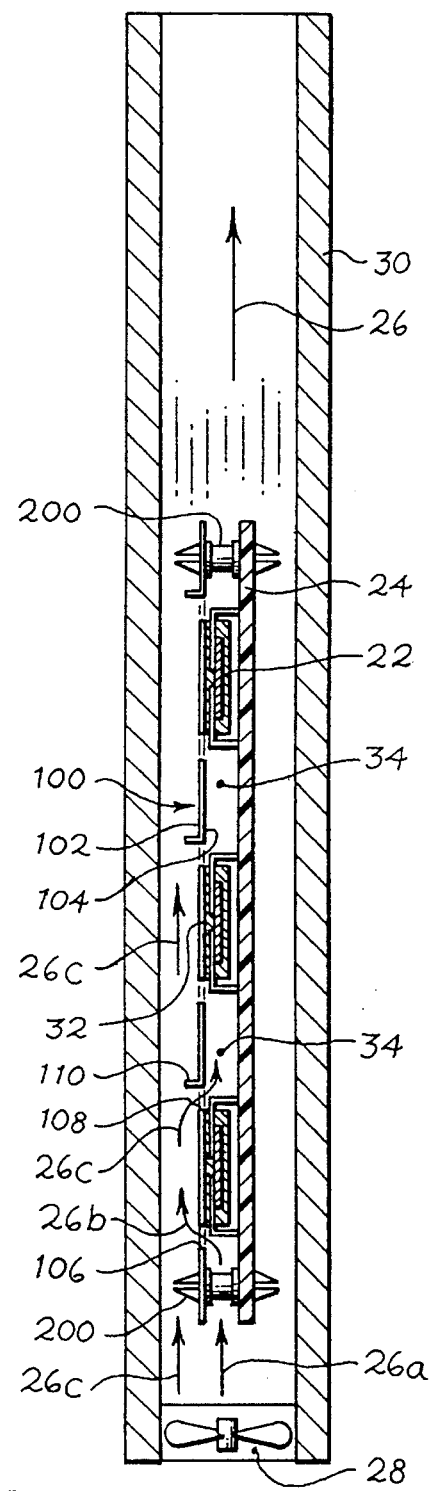
Fig. 1.
Fig. 2.

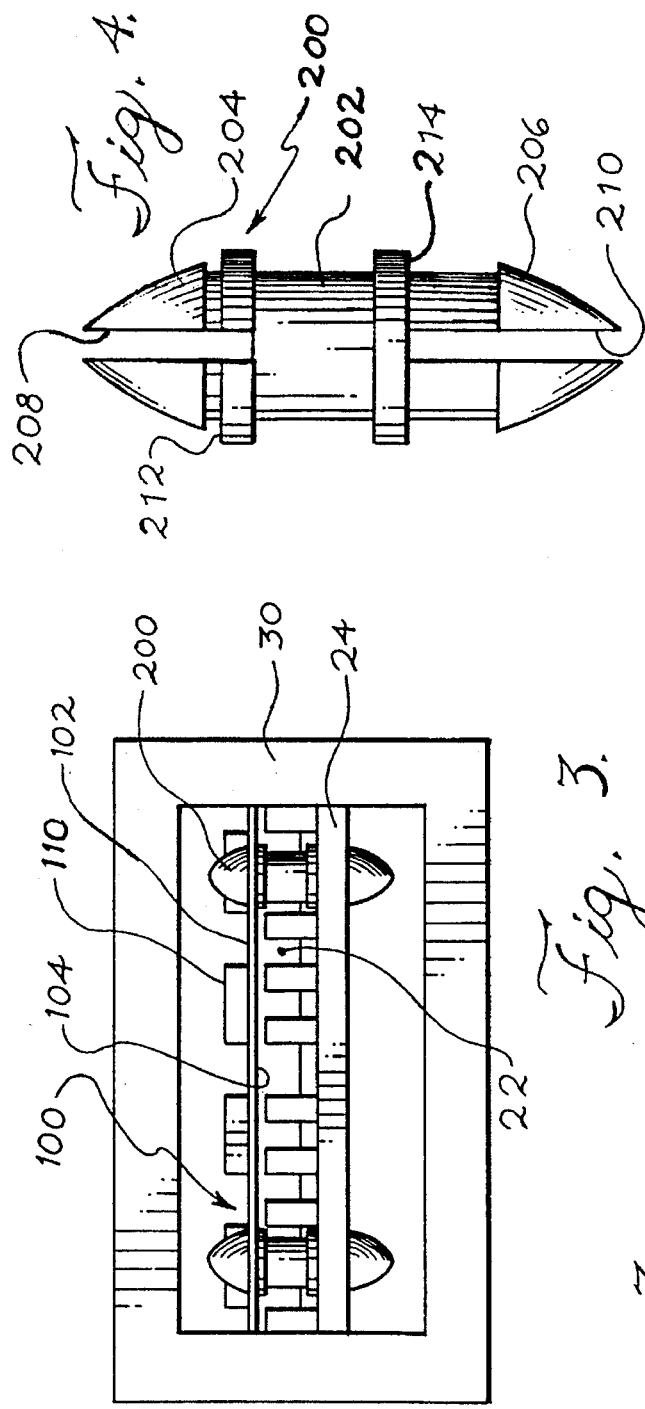
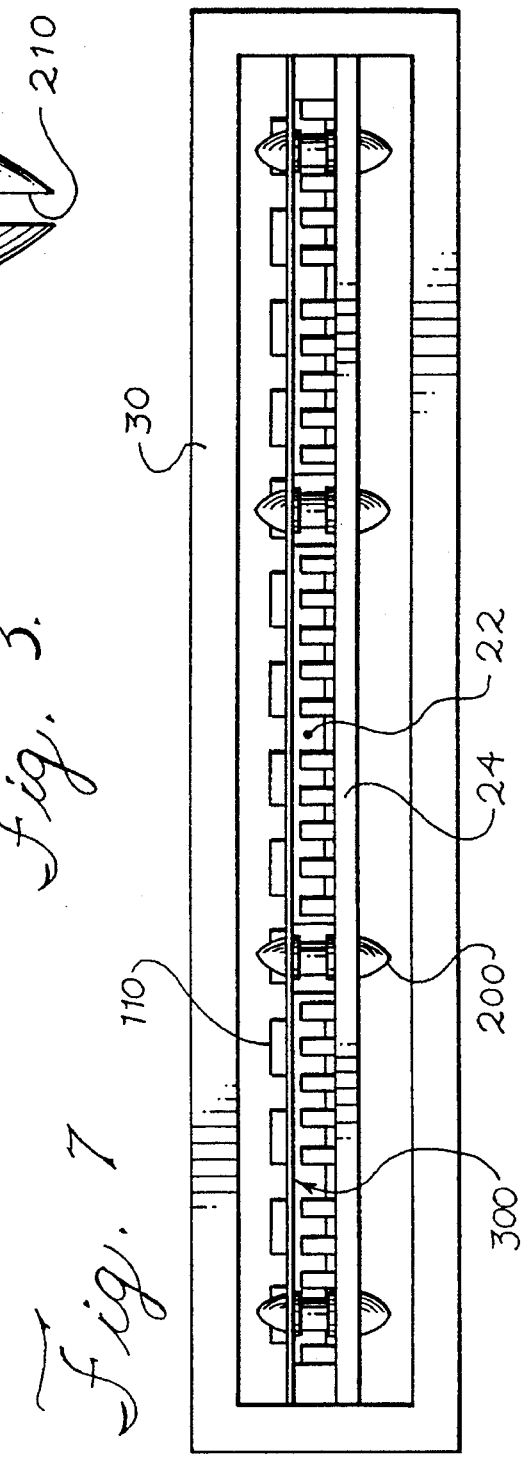

AIR MIXER COOL PLATE

This is a continuation of application Ser. No. 07/867,867 filed on Apr. 10, 1992, now abandoned.

FIELD OF THE INVENTION

The present invention relates to devices for cooling a collection of heat-generating components positioned in close proximity to one another, and more particularly to devices for dissipating heat by conduction and convection from a plurality of semiconductor modules supported on a card.

BACKGROUND OF THE INVENTION

In a variety of technological contexts the need exists to remove heat from a plurality of closely positioned heat-generating elements. For instance, to maximize the longevity of semiconductor modules positioned on a card or board designed for installation in a computer, it is important that heat generated by the modules be effectively dissipated.

Systems for achieving such heat dissipation are known. For instance, Zushi et al. disclose in U.S. Pat. No. 4,837,663 (the "'663 patent") a system for cooling a plurality of semiconductor devices positioned on printed circuit boards mounted in a computer. The system of the '663 patent comprises a fan for causing air to flow through the rack on which the circuit boards are supported and a draft duct for dividing the air flow into a plurality of partial air flows.

Cooling systems of the type disclosed in the '663 patent generally provide satisfactory heat dissipation when used with relatively low power semiconductor devices and when such devices are packed on a circuit board such that a relatively large spacing exists between devices. However, such cooling systems do not provide adequate heat dissipation when used with relatively high power semiconductor devices due to the relatively large amount of heat such devices generate. Furthermore, cooling systems of the type disclosed in the '663 patent do not provide adequate heat dissipation when semiconductor devices are positioned on a circuit board in accordance with current packing densities.

It is believed that cooling systems of the type disclosed in the '663 patient do not provide adequate cooling when used with relatively high power semiconductor devices packed at relatively great densities, in part, due to the existence of an air boundary layer or "dead air" zone which is believed to exist adjacent the top surfaces of the semiconductor devices. Such "dead air" zone constitutes a planar region overlying the semiconductor devices where little or no air flow occurs. Due to the existence of such "dead air" zone, cooling air flowing over the semiconductor devices does not extract heat from the top surfaces of the devices as effectively as is desired. Furthermore, because of the "dead air" zone, cooling air does not tend to flow into the spaces between semiconductor devices. As a result, heat is not dissipated very effectively from the sides of the devices.

Systems are known for channeling the flow of cooling air provided adjacent semiconductor devices mounted on a card or circuit board so as to cause such air to diverge from its path of travel and flow into more direct contact with such devices. Such systems are disclosed, for instance, in U.S. Pat. Nos. 4,996,389 to Kajiwara et al. and 5,021,924 to Kieda et al. Unfortunately such systems do not tend to redirect the flow of cooling S air so as to cause such air to enter the spaces between the semiconductor devices. Instead, the air is merely redirected so as to flow over the top surfaces of such devices, with the result that the full cooling potential of the air is not utilized.

Other known apparatus for removing heat from semiconductor devices include heat-dissipating fins, as disclosed in U.S. Pat. No. 4,961,125 to Jordan et al. (the '125 patent), and "cold plates," as disclosed in U.S. Pat. No. 5,016,090 to Gaylon et al. Although fins of the type disclosed in the '125 patent tend to provide effective cooling of the semiconductor devices with which they are associated, they are often relatively expensive and frequently require more space than is desired. Conventional cool plates do not contain structure for redirecting the flow of air passing over the top surface of the cool plate so as to cause such air to flow into direct contact with the heat-generating devices engaging the bottom surface of the cool plate. Absent such structure, conventional cool plates do not provide the degree of cooling desired.

SUMMARY OF THE INVENTION

The present invention is a device for dissipating heat from a plurality of heat-generating elements, e.g., an array of semiconductor modules positioned on a card, which elements are positioned in an airstream traveling in a first direction. The device includes a plate made from a material having a thermal conductivity ranging from 1 to 500 watts/ meter K. The plate has a plurality of first and second apertures extending therethrough. The apertures are arranged so that when the plate is supported in predetermined relation to the series of heat-generating elements, one of the first apertures is positioned immediately before each element, as measured in the first direction along the top surface of the plate, and one of the second apertures is positioned immediately after each element, as measured in the first direction along the top surface of the plate.

The plate also includes a plurality of deflectors that extend upwardly a predetermined distance from the top surface of the plate. The deflectors are positioned immediately after each of the second apertures, as measured in said first direction along the top surface of said plate.

Air traveling along the top surface of the plate is deflected by the deflectors so as to pass through the second apertures adjacent the deflectors into the region between the elements. After contacting the elements, and thereby extracting heat from the elements, the air exits the region between the elements via the first apertures. Such heated air rejoins the principal flow of the airstream and is quickly carried away. This process of redirecting air flow breaks air boundary layers adjacent the top surfaces of the heat-generating elements and mixes regions of warm and cool air adjacent the elements, thereby creating greater uniformity of temperature in such air and improving heat transfer.

The process of redirecting the flow of air adjacent the heat-generating elements causes heat dissipation by convection. At the same time, heat is dissipated from the elements by conduction due to the relatively high thermal conductivity of the plate which contacts the top surface of the heat-generating elements.

BRIEF DESCRIPTION OF THE DRAWINGS

FIG. 1 is a top view of the present invention, with a top portion of the conduit being removed to reveal the air mixer cool plate and with portions of the heat-generating elements and support card associated with the elements being visible through apertures the plate;

FIG. 2 is a cross-sectional side view taken along line 2—2 in FIG. 1;

FIG. 3 is an end view of the plate, heat-generating elements and card illustrated in FIG. 1;

FIG. 4 is a side view of a fastener for securing the plate in predetermined fixed relation to the card on which the heat-generating elements are supported;

FIG. 7 is an end view of the plate and heat-generating elements illustrated in FIG. 5.

DETAILED DESCRIPTION OF THE INVENTION

Figure 6:
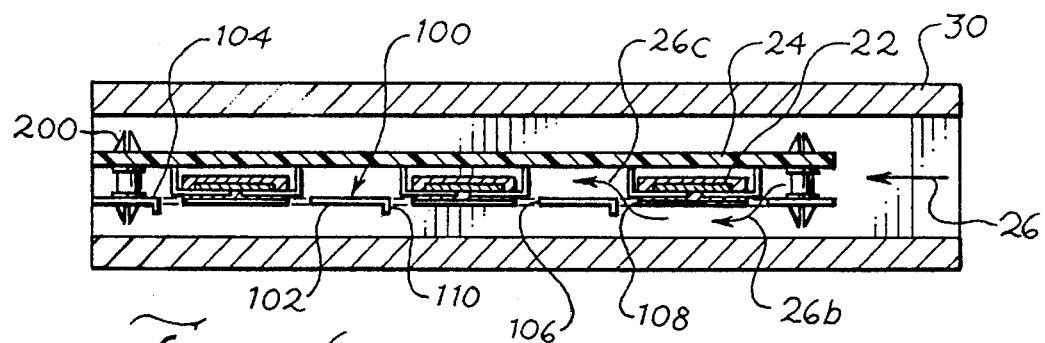
FIG. 6 is a cross-sectional side view taken along line 6—6 in FIG. 5.

Referring to FIGS. 1–3, the present invention is an air mixer cool plate 100 for dissipating heat from a plurality of heat-generating devices positioned in an air stream. Although plate 100 provides effective heat dissipation with regard to a wide range of heat generating devices, the plate is particularly designed to dissipate heat from a plurality of semiconductor modules 22 mounted on a board or card 24, which modules and board are positioned in an air stream 26 extending in a first direction. Air stream 26 is generated by a conventional fan 28 positioned adjacent one end of board 24. Typically, modules 22 and board 24 are positioned in a hollow conduit 30 for constraining and defining the direction of flow of air stream 26. However, as discussed in greater detail hereinafter, the present invention will function effectively even when modules 22 and board 24 are not positioned in a conduit 30 so long as air stream 26 is directed to flow past the modules and board in a predetermined direction relative thereto.

Modules 22 typically have a planar top surface 32 (FIG. 2) and are positioned in mutually spaced relation on board 26 so that a gap 34 exists between adjacent modules, as measured in the direction of flow of air stream 26. As illustrated in FIG. 1, modules 22 are typically mounted in a column on board 24, although other arrangements may also be used.

Air mixer cool plate 100 is made from a material having a relatively high thermal conductivity, i.e., a thermal conductivity arranging from 1 to 500 watts/meter-K. In the preferred embodiment, plate 100 is made from copper. The thickness of plate 100 will vary as a function of the thermal conductivity of the material used, the degree of heat dissipation desired, the rate of flow of air stream 26 and other factors, as those of ordinary skill in the art will readily appreciate. In general, the thickness of plate 100 will vary inversely with the thermal conductivity of the plate. Plate 100 preferably has a thickness ranging from 0.1 mm to 5 mm, with a preferred embodiment of plate 100 having a thickness of 0.25.

Plate 100 has a top surface 102 and a bottom surface 104. Preferably, plate 100 has a planar configuration, although the configuration of the plate may vary based on the planarity of the surface on which modules 22 are supported. Thus, for instance, if board 24 has an arcuate configuration, plate 100 is formed to have a related arcuate configuration. In any event, plate 100 is configured so that its bottom surface 104 may be positioned to simultaneously engage the top surfaces 32 of all of the modules 22 mounted on board 24.

Plate 100 includes a plurality of upstream apertures 106 extending therethrough and a plurality of downstream apertures 108 extending therethrough. As used herein the term "upstream" means relatively closer to fan 28 and the term "downstream" means relatively farther away from fan 28. Apertures 106 and 108 are formed in plate 100 so that when the latter is secured by attachment mechanisms 200 (described hereinafter) in predetermined relation to board 24, a pair of apertures 106 and 108 will be positioned in selected relation to each of the modules 22. Such selected relation involves positioning upstream aperture 106 immediately upstream of the upstream edge of an associated module 22 and positioning upstream aperture 108 so that it is immediately downstream of the downstream edge of the associated module 22, as illustrated in FIG. 1.

Plate 100 also comprises a plurality of air deflectors 110 that extend upwardly from its top surface 102. Deflectors 110 are preferably positioned at the downstream edge of downstream apertures 108, i.e., so that the upstream edge of the deflector intersects the downstream edge of the associated aperture 108. However, under certain circumstances, satisfactory air deflection may be achieved when deflectors 110 are positioned somewhat downstream of the downstream edge of aperture 108. The distance air deflectors 110 project upwardly above top surface 102 will vary with application and rate of flow of air stream 26, although the deflectors should project above top surface 102 a distance sufficient to cause portions of the air stream to enter and exit regions 34 between modules 22, as discussed in greater detail hereinafter. For most applications, adequate air deflection is achieved when deflectors 110 extend about 0.25 mm to 5 mm above top surface 102 of plate 100. In one embodiment of the invention, deflectors 110 project about 1 mm above top surface 102.

The width of apertures 106 and 108, as measured in the X dimension (see FIG. 1), will vary as a function of the height of deflectors 110, the rate of flow of airstream 26, and the spacing between modules 22. Routine experimentation will indicate the optimum spacing from the standpoint of maximum heat dissipation. However, in one embodiment of the invention, apertures 106 and 108 had a width of about 3.8 mm. The length of apertures 106 and 108, as measured in the Y dimension (see FIG. 1), is preferably about equal to the width of the apertures. Here too, routine experimentation will indicate the optimal length for apertures 106 and 108.

As noted above, a plurality of attachment mechanisms 200 are provided for securing plate 100 relative to board 24 such that the plate is positioned in predetermined relation to modules 22. One embodiment of the attachment mechanisms 200, as best illustrated in FIG. 4, is designed to secure plate 100 directly to board 24. This embodiment of attachment mechanisms 200 consists of an elongate shaft 202 made from a resilient material, such as nylon. Shaft 202 terminates in frusto-conical ends 204 and 206. End 204 is bifurcated by slot 208 into two portions and 206 is bifurcated by slot 210 into two portions. Shaft 202 includes an annular groove 212 at the base of end 204 and an annular groove 2141 at the base of end 206. This embodiment of attachment mechanism 200 is sized so that as end 204 is urged into a bore in plate 100 having a diameter about equal to the diameter of annular groove 212, the bifurcated portions of end 204 will move toward one another, thereby permitting the end to be received in the bore. Once end 204 is fully received in the bore in plate 100, the bifurcated portions of end 204 will expand, thereby captivating the end within the bore and securing attachment mechanism 200 to plate 100. End 206 is installed in 20 similar fashion in a bore in board 24.

Alternatively, board 100 may be secured to conduit 30 or attached to frame structure (not shown) forming part of the device in which board 24 is installed.

Regardless of the specific design or point of attachment of the plurality of attachment mechanisms 200, it is important that the mechanisms be designed and attached so that plate 100 is supported relative to modules 22 such that apertures 106 and 108 are maintained in selected registration with the modules, as discussed above.

Although modules 22, board 24 and plate 100 are illustrated in FIGS. 1–3 as being received in conduit 30, it is to be appreciated that such a conduit is not required. For instance, one or more boards 24 may be installed in the hollow interior of the housing of a personal computer such that the boards 24, and plates 100 secured thereto, extend parallel to the direction of flow of air stream 26 and air deflectors 110 are positioned immediately downstream of downstream apertures (i.e., the apertures adjacent to the downstream ends of modules 22). When plates 100 are used in conjunction with a plurality of boards 24 extending in mutual parallel relation, the boards should be relatively spaced and the height of deflectors 110 should be selected so that a gap exists between the upper surface of deflectors 110 and the bottom surface of the adjacent boards 24.

In operation, portions 26A (FIG. 2) of air stream 26 enter the region between board 24 and plate 100. Upon contacting the upstream sides of the first module 22, air stream portions 26A are deflected upwardly so as to pass through upstream apertures 106, as indicated by arrows 26B. Air stream portions 26A are heated as a consequence of their contact with module 22 and carry such heat upwardly into the region between plate 100 and conduit 30 where the heated air mixes with relatively cooler air and is rapidly carried away.

Portions 26C of air stream 26 traveling between conduit 30 and top surface 102 of plate 100 contact air deflectors 110 and are urged downwardly through the associated downstream apertures 108 into the region 34 between adjacent modules 22. Portions 26C of the air stream extract heat from the modules 22, which heat, along with heat extracted by air stream portions 26B, passes out via upstream apertures 106, as discussed above. Thus, apertures 106 and 108, together with air deflectors 110 cause air flowing adjacent plate 100 to move in a "zig-zag" fashion into and out of the regions 34 between adjacent modules.

At the same time air stream 26 is extracting heat from modules 22, plate 100 is conducting heat away from the modules as a consequence of its intimate contact with the top surfaces of the modules and its relatively high thermal conductivity. Such heat is then dissipated by the portions of air stream 26 that travel over the top surface of the plate. In some cases it may be desirable to deposit a thermal packing "glue" (not shown) on top surfaces 32 of modules 22 to ensure plate 100 remains firmly engaged with the modules, thereby enhancing heat conduction from the modules.

Figure 5:
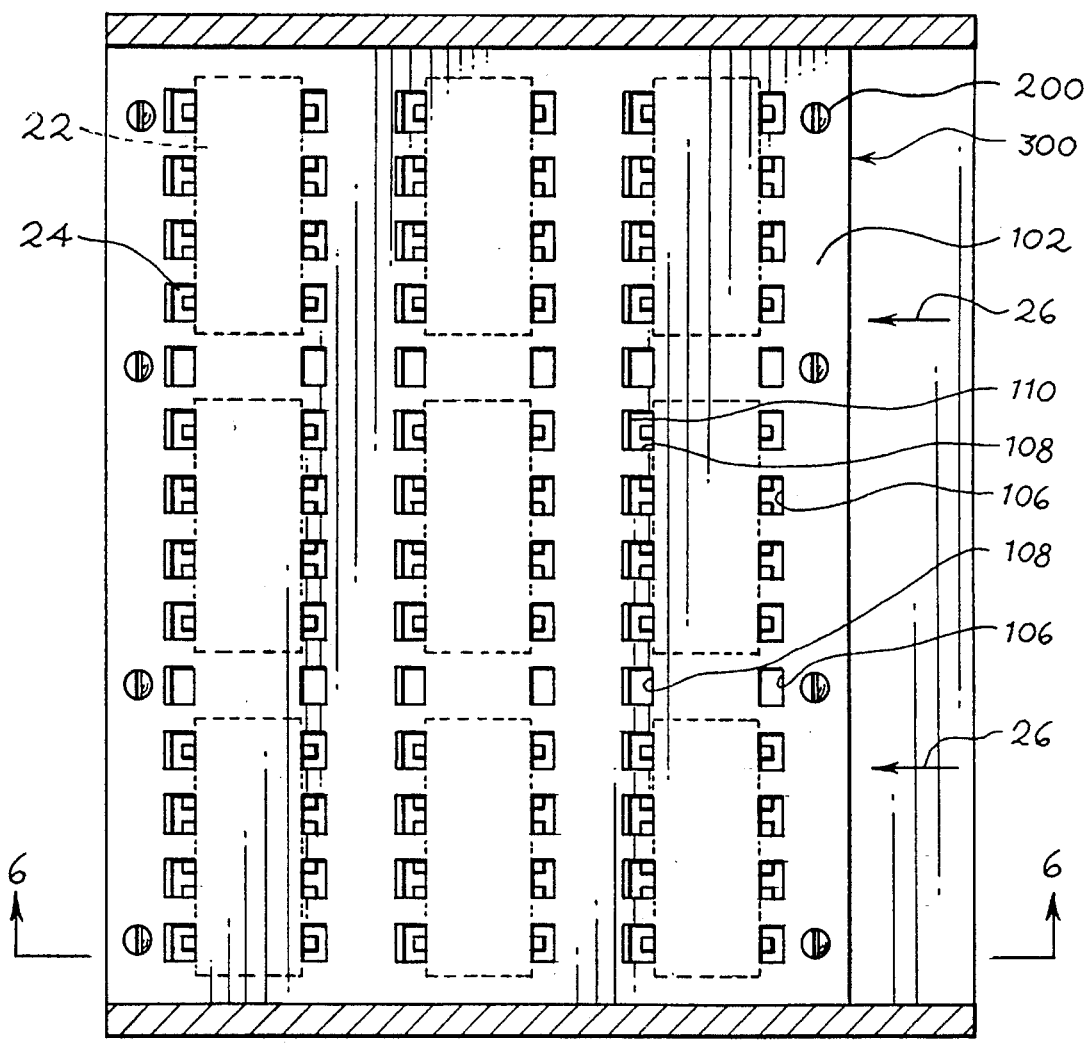
FIG. 5 is a top view of an alternative embodiment of the present invention, with a top portion of the conduit being removed to reveal the alternative embodiment of the air mixer cool plate and with the heat-generating elements being illustrated in phantom view.

Although plate 100 has been described and illustrated with respect to a single column of modules 22, it is to be appreciated that the plate may be modified for use with multiple columns of modules 22. Plate 300, illustrated in FIGS. 5–7, exemplifies one such modification of plate 100. Because plate 300 is designed for use with three parallel columns of modules 22, the plate includes four upstream apertures 106 and four downstream apertures 108 adjacent each module. In addition, an upstream aperture 106 and a downstream aperture 108 is positioned between each pair of adjacent modules. As with plate 100, plate 300 includes a deflector 110 adjacent each downstream aperture 108.

Plate 300 functions in substantially the same way as plate 100, as described above, except that the "zig-zag" airflow created by deflectors 110 and apertures 106 and 108 occurs relative to the three parallel columns of modules 22.

Although the design and operation of plate 100 has been described with regard to semiconductor modules 22, it is to be appreciated that plate 100 may be satisfactorily used with a wide variety of heat-generating elements positioned in an air stream extending in a first direction so long as the following requirements are satisfied. First, plate 100 should be supported so that apertures 106 and 108 are positioned relative to the heat generating elements in the manner described above. Second, plate 100 should be supported so that apertures 106 and 108 and deflectors 110 are positioned relative to the direction of flow of the air stream in the manner described above. Third, bottom surface 104 of plate 100 should be configured and positioned to engage to top surfaces of the heat-generating elements.

Since certain changes may be made in the invention described herein, it is intended that the foregoing specification and associated drawings be interpreted in an illustrative and not in a limiting sense.

What is claimed is:

1. A semiconductor module system comprising:

fan means for generating an air stream extending in a first direction;

a series of semiconductor modules positioned in spaced relation in a selected planar array, said modules being supported adjacent said fan means so that said modules are positioned in said air stream and the plane of said planar array extends substantially parallel to said first direction;

a flat plate made from a material having a thermal conductivity ranging from 1 to 500 watts/meter-K, said plate having top and bottom surfaces and a thickness ranging from 0.1 mm to 5 mm, said bottom surface of said plate engaging said modules;

a plurality of first and second apertures extending through said plate, at least one of said first apertures being positioned before each module, as measured in said first direction along said top surface of said plate, and at least one of said second apertures being positioned after each module, as measured in said first direction along said top surface of said plate; and a plurality of deflectors attached to said plate extending upwardly from said top surface of said plate about 0.25 mm to 5 mm, one of said plurality of deflectors being positioned immediately after a corresponding respective one of said second apertures, as measured in said first direction along said top surface of said plate.

2. A system according to claim 1, wherein said plate is made from copper.

3. A system according to claim 1, wherein the device includes attachment means for securing said plate to a substrate to which the elements can be attached so that said plate is supported in said predetermined relation to the elements and so that said bottom surface of said plate engages the elements.

4. A system according to claim 1, wherein said predetermined distance said deflectors extend upwardly from said top surface ranges from 0.25 mm to 5 mm.

5. A system according to claim 1, wherein said first and second pluralities of apertures are sized so as to permit said plurality of deflectors to deflect portions of said air stream flowing over said top surface of said plate so as to cause said portions to pass through said second apertures into spaces between said elements and then pass out of said spaces via adjacent first apertures.

6. A system according to claim 1, wherein said plate has a thermal conductivity of about 350 watts/meter-K and a thickness of about 0.25 mm.

7. A system according to claim 1, further comprising a conduit, positioned adjacent said fan and sized to receive the heat-generating elements, the support, and said plate, for directing and constraining the flow of said air stream.

\* \* \* \* \*